United States Patent [19]
Wu

[11] Patent Number: 6,137,132
[45] Date of Patent: *Oct. 24, 2000

[54] HIGH DENSITY BURIED BIT LINE FLASH EEPROM MEMORY CELL WITH A SHALLOW TRENCH FLOATING GATE

[75] Inventor: Shye-Lin Wu, Hsinchu, Taiwan

[73] Assignee: Acer Semiconductor Manufacturing Inc., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/109,348

[22] Filed: Jun. 30, 1998

[51] Int. Cl.$^7$ .................................................. H01L 29/788
[52] U.S. Cl. .......................................... 257/315; 257/314
[58] Field of Search ..................... 257/298, 314, 257/315–326; 438/257, 258, 259, 260

[56] References Cited

U.S. PATENT DOCUMENTS

| | | | |
|---|---|---|---|
| 5,180,680 | 1/1993 | Yang | 438/259 |
| 5,338,953 | 8/1994 | Wake | 257/316 |
| 5,364,810 | 11/1994 | Kosa et al. | 437/52 |
| 5,429,970 | 7/1995 | Hong | 257/316 |
| 5,495,441 | 2/1996 | Hong | 257/316 |

OTHER PUBLICATIONS

Albert Bergemont et al., *Low Voltage NVG™: A New High Performance 3 V/5 V Flash Technology for Portable Computing and Telecommunications Applications*, IEEE Transactions on Electron Devices, vol. 43, No. 9, Sep. 1996, pp. 1510–1517.

R. Kazerounian et al., *Alternate Metal Virtual Ground Eprom Array Implemented in a 0.8 μm Process for Very high Density Applications*, 1991 IEEE, pp. 311–314.

J.D. Bude et al., *Secondary Electron Flash — a High Performance, Low Power Flash Technology for 0.35 μm and Below*, 1997 IEEE, pp. 279–282.

T.P. Ong et al., *CVD SiN$_x$ Anti–reflective Coating for Sub–0.5 μm Lithography*, 1995 Symposium on VLSI Technology Digest of Technical Papers, pp. 73 and 74.

Paul–Henri Bricout et al., *Short–Channel Effect Immunity and Current Capability of Sub–0.1–Micron MOSFET's Using a Recessed Channel*, IEEE Transactions on Electron Devices, vol. 43, No. 8, Aug. 1996, pp. 1251–1255.

S.Y. Ueng et al., *Superior Damage–Immunity of Thin Oxides Thermally Grown on Reactive–Ion–Etched Silicon Surface in N$_2$O Ambient*, IEEE Transactiuons on Electron Devices, vol. 41, No. 5, May 1994, pp. 850 and 851.

T. Yoshitomi et al., *Silicided Silicon–Sidewall Source and Drain (S$^4$D) structure for high–performance 75–nm gate length pMOSFETs*, 1995 Symposium on VLSI Technology Digest of Technical Papers, p. 11.

*Primary Examiner*—Tom Thomas
*Assistant Examiner*—Ori Nadav
*Attorney, Agent, or Firm*—Harness, Dickey & Pierce, P.L.C.

[57] ABSTRACT

The structure of flash EEPROM is formed on a composite substrate, wherein said composite substrate comprises: a pad oxide layer formed on a semiconductor substrate; an n-type doped dielectric layer is formed on the pad oxide layer. A nitride layer is formed on the n-type doped oxide layer. The composite substrate has a trench. An oxynitride layer which serves as coupling oxide layer is formed on surfaces of sidewalls and bottom of portion of the semiconductor substrate of the trench. The trench is filled with an n-type conductive doped polysilicon layer. The n-type conductive doped polysilicon layer serves as a floating gate of EEPROM. A conductive layer, a semiconductor substrate layer doped by using aforementioned n-type dopant containing oxide as a diffusion source, serves as buried bit lines being formed in the semiconductor substrate and abutting the pad oxide layer. An ONO layer is formed on the polysilicon layer and the nitride layer. Finally, another n+ conductive layer is formed on the ONO layer as word line.

17 Claims, 6 Drawing Sheets

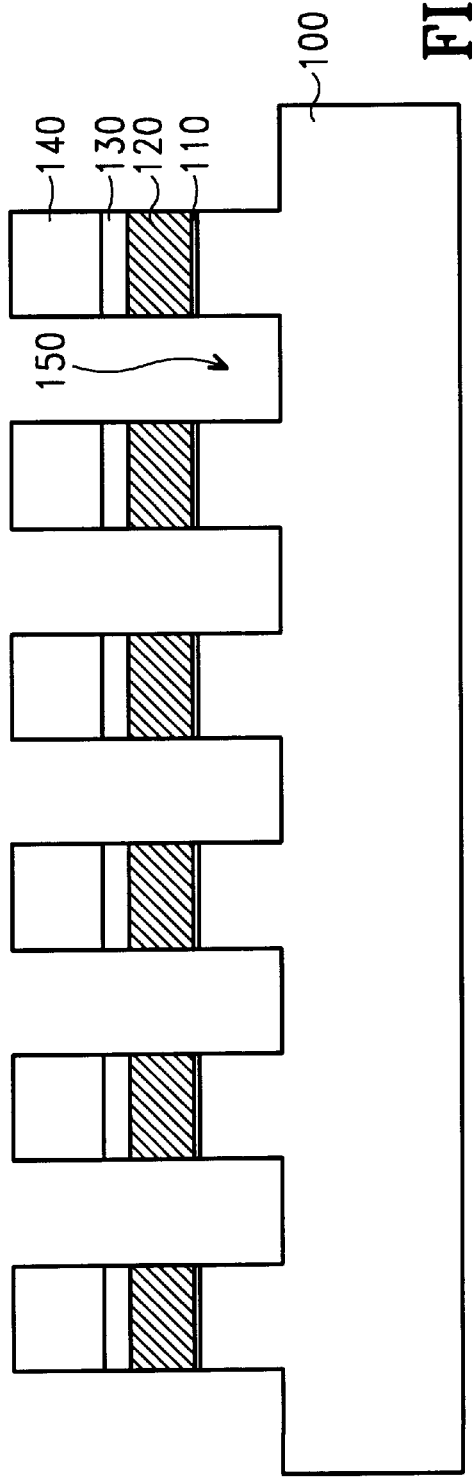
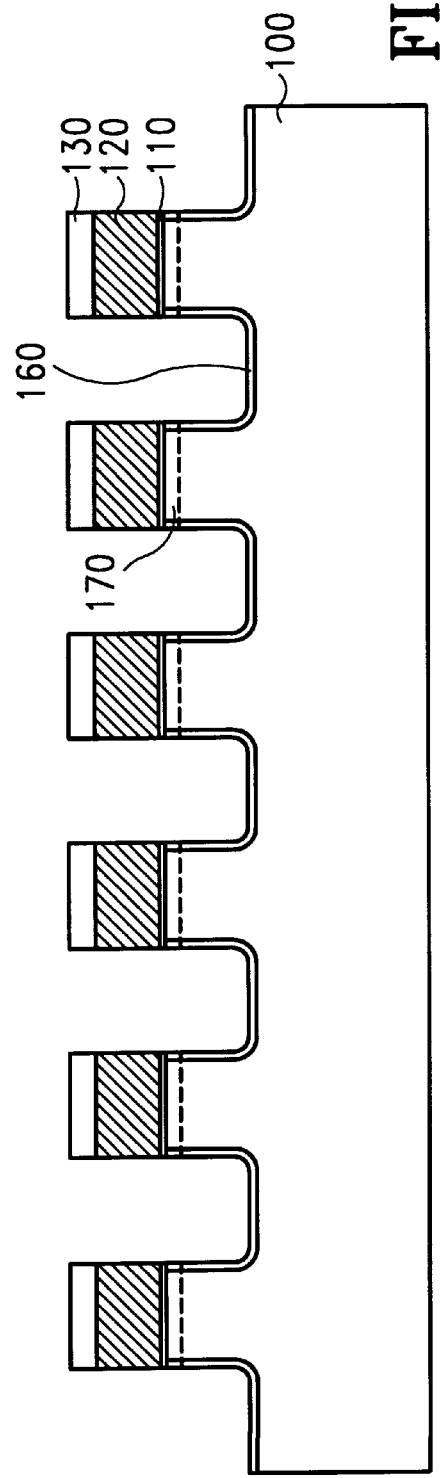

HIGH DENSITY BURIED BIT LINE FLASH EEPROM MEMORY CELL WITH A SHALLOW TRENCH FLOATING GATE

FIELD OF THE INVENTION

The present invention relates to a semiconductor memory process, and more specifically, to a structure of high-density buried bit line flash EEPROM memory cell with a shallow trench-floating gate.

BACKGROUND OF THE INVENTION

In recently years, the development of portable telecommunications and laptop computers has become a major driving force in the design and technology related to semiconductor IC's. This growing market requires low power, high-density and electrically re-writable nonvolatile memories. Electrically erasable programmable read only memories (EEPROM) which are electrically erased on a byte-by-byte basis is one choice. However, the cell size of the EEPROM is too large for application, and thus flash memory is another choice because of its small size and highly reliability.

For achieving high density memory device, Kazerounian et al., introduced a virtual ground concept using alternative metal virtual ground (AMG) to fabricate EPROM in the paper, R. Kazerounian, et al., "Alternate Metal Virtual Ground EPROM Array Implemented in a 0.8 μm Process for Very High Density Applications", IEDM Tech. Dig., p. 311, 1991." The synoptic layout and cross-sectional ofthis memory array are shown in FIGS. 1a–b, The front end of the process is a standard n-well CMOS process. After LOCOS field oxidation and EPROM gate a layer of the polysilicon 10 is deposited, and an ONO dielectric layer 15 is then formed on the top of polysilicon 10. The ONO 15/poly-Si 10 is then patterned in elongated strips across each segment. Subsequently, a self-aligned arsenic implant form bit lines 20. The oxidation process combines with the CMOS gate oxidation process to form gate oxide and to grow a bit line oxide. The process continues with doped polysilicon 25 and tungsten silicide 35 deposition. A self-aligned stack gate etch process is employed to define word line 25 and floating gate cell 40. The advantages of this array are the reduction of drain turn-on induced punchthrough and the allowance of scaling of effective channel length to as low as 0.25 μm.

Later, the virtual ground concept was applied to manufacture low voltage NOR virtual ground power flash memories by Bergemont, et al. The flash memory is known with fast access time. This is discussed in the reference, A. Bergemont, et al., Low voltage NVGTM: A New High Performance 3 V/5 V Flash Technology for portable Computing and Telecommunications Applications", IEEE Trans. Electron Devices, ED-43, p. 1510, 1996. The architecture of NVGTM is similar to AMG EPROM and with features that one metal bit-line shared between two columns of cells. These metal bit-lines are strapped to every other diffusion bit-line (strapped, continuous bit lines) through the selected transistors.

SUMMARY OF THE INVENTION

The prior art demonstrates some problems, such as punch-through issue or narrow space between the adjacent bit lines and short channel effect. Thus in the present invention, a flash EEROM using a recessed silicon trench floating gate for suppressing the short channel effect and the method of fabricating buried bit line flash EEROM are briefly described as follows.

The structure of flash EEPROM cell is formed on a composite substrate, wherein said composite substrate comprises a pad oxide layer formed on a semiconductor substrate and an n-type doped dielectric layer formed on the pad oxide layer. A first isolation layer, such as nitride layer, is formed on the n-type doped dielectric layer. The composite substrate has a trench. An oxynitride layer, which serves as coupling oxide, is formed on surfaces of sidewalls and bottom of portion of the semiconductor substrate of the trench. The trench is filled with second conductive layer, an n-type conductive doped polysilicon layer. The n-type conductive doped polysilicon layer serves as floating gate of EEPROM. A first conductive layer, a semiconductor substrate layer doped by using n-type dopant containing dielectric as a diffusion source, serves as buried bit lines being formed in the semiconductor substrate and abutting the pad oxide layer. A second isolation, such as ONO layer is formed on the second conductive layer and the first isolation. Finally, a third conductive layer (e.g. a n+ polysilicon layer) is formed on the second isolation as word lines.

The fabricating method comprises following steps: First, an ultra-thin pad oxide layer about 2–20 nm in thickness and a n+ (such as phosphorus with concentrations of about $5\times10^{19}$–$5\times10^{21}$/cm$^3$) doped oxide layer is successively formed on the silicon substrate. Then, a thin nitride layer of about 10–50 nm is. deposited on all surfaces as an antireflection coating layer. After coating a patterned mask on the nitride layer to define a buried bit line regions, a dry etch is used to etch the unmask region till the silicon substrate is slightly recessed to form shallow trenches about 50–600 nm in depth. Subsequently, the photoresist is stripped, and an oxidation process at a temperature about –800–-1150° C. to grow an oxynitride layer of about 3–25 nm in thickness on resultant surface and to form buried bit line using dopants in the oxide layer as a diffusion source. After refilling a trench with n+ doped silicon layer, a planarization process such as CMP is done to form a plain surface using the nitride layer as an etching stopped layer. A stacked ONO layer of about 5–30 nm is then deposited as an interpoly dielectric layer and finally another n+ doped polysilicon layer is formed and patterned to be as word lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4. is a cross-sectional view of patterning the nitride layer, the oxide layers and recessing the silicon substrate to define a plurality of floating region, in accordance with the present invention;

FIG. 5. is a cross-sectional view of performing an oxidation process to grow a thin oxynitride layer on the resultant surfaces and to form buried n+ bit line diffused from n+ doped oxide, in accordance with the present invention;

DETAILED DESCRIPTION OF THE PREFERRED EMBODIMENT

A structure and a method of fabricating high density buried bit line flash EEROM with a floating gate in a trench of silicon substrate to prevent the short-channel effect are disclosed. One exemplary structure will first be described and a preferred fabricating method will then be depicted and discussed later. The detailed EEROM structure is best illustrated by reference to the drawings, and is described as follows.

Figure 8:
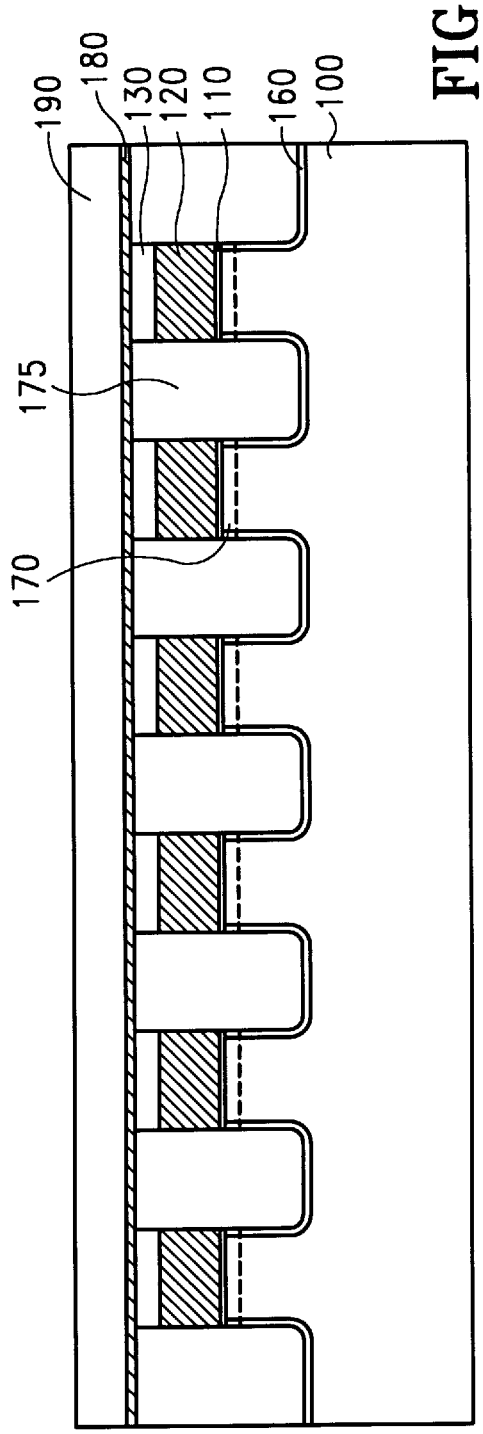
FIG. 8. is a cross-sectional view of depositing second n+ polysilicon as word lines, in accordance with present invention.

Referring to FIG. 8, a structure is illustrated of buried bit line flash EEPROM cell with a trench floating gate constructed in a composite layer which is formed on a semiconductor substrate 100. The composite layer comprises a pad oxide layer 110, a phosphorus doped dielectric layer 120 and a nitride layer 130. The pad oxide layer 110 is formed on the semiconductor substrate 100. The phosphorus doped dielectric layer 120 and a nitride layer 130 are sequentially formed on the pad oxide layer 110. The composite layer has a trench therein, which includes a bottom coming down into the semiconductor substrate 100. The gate oxide 160 of the flash EEPROM cell is formed of an oxynitride layer which is in the sidewalls and the bottom of the trench 150 (please see FIG. 4 and FIG. 8). The floating gate 175 of the flash EEPROM cell is a n-type conductive doped polysilicon formed on the oxynitride layer 160 and filled in the remaining trench. The buried bit line 170 is a conductive layer formed beneath the remaining pad oxide layer 110. The interpoly dielectric layer 180 of the flash EEPROM cell formed of an ONO layer (i.e., oxide layer/nitride layer/oxide layer) is formed on the floating gate 175, and the nitride layer 130. The word line 190 is a n+ doped polysilicon layer formed on the interpoly dielectric layer 180.

Figure 1A:
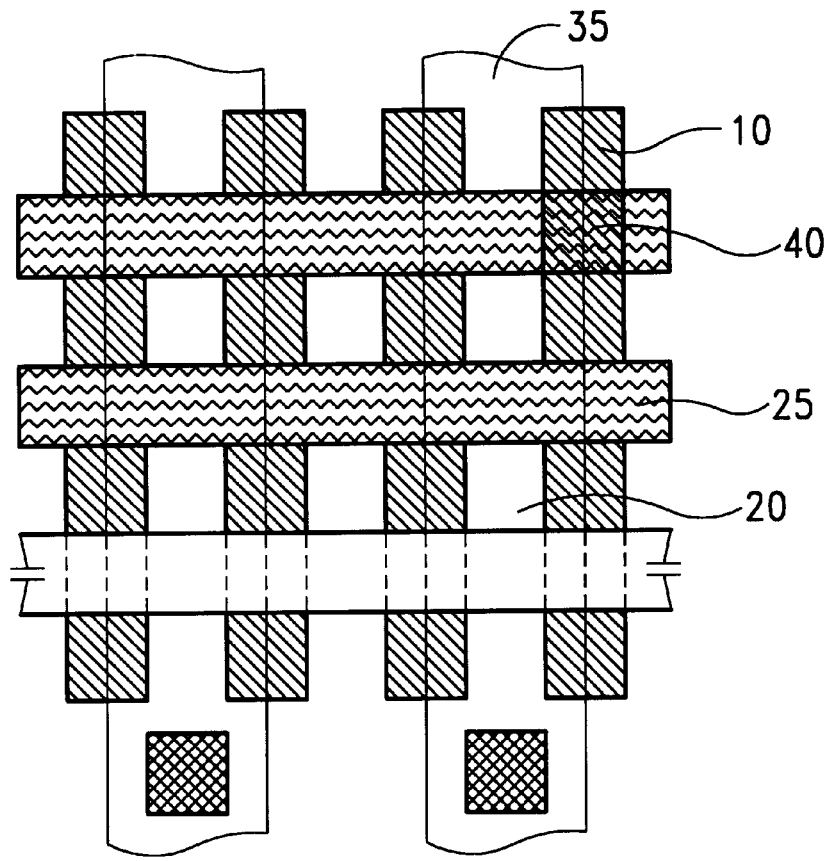
FIG. 1. is a synoptic layout of an EPROM array (FIG. 1a), and (FIG. 1b) is a cross-sectional view of an EPROM array, in accordance with the prior art.
Figure 1B:
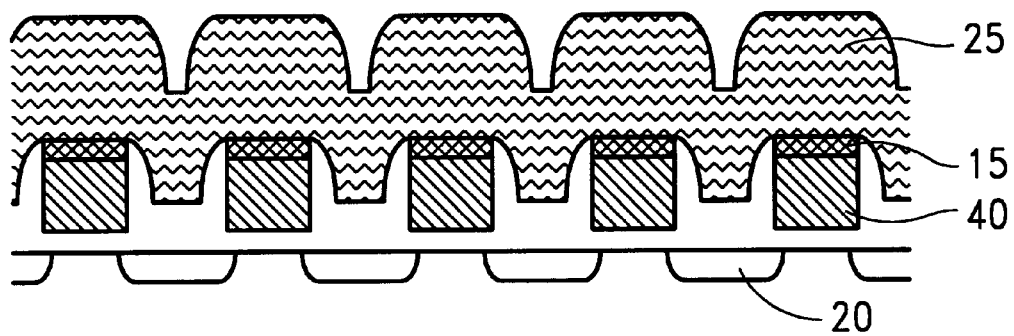
Figure 2:
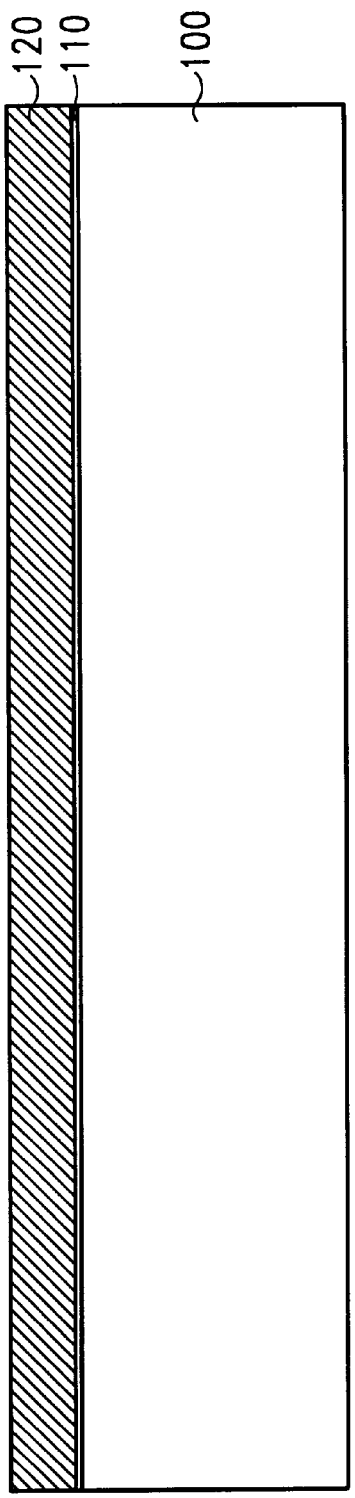
FIG. 2. is a cross-sectional view of forming a n+-doped oxide layer on the pad oxide layer, in accordance with the present invention.

The method of fabricating the mask ROM is illustrated as follows:

Referring to FIG. 2, an ultra-thin pad oxide layer 110 is formed using a CVD method or thermal growing method on a silicon substrate 100. The pad oxide 110 thickness is about 2–20 nm. Then a high concentration in-situ n-type doped dielectric layer 120 is deposited on the pad oxide 110. In a preferred embodiment the dielectric layer 120 is a PSG layer (phosphosilicate glass) 120 deposited by applied APCVD (atmospheric pressure CVD) process at temperatures about 300–750° C. The doping concentration of phosphorus can be controlled by adjusting the PH$_3$ flow, in accordance with the equation:

$$SiH_4+PH_3+O_2 \rightarrow SiO_2+2P_2O_5+8H_2$$

Preferably, the doping concentration is about $5 \times 10^{19} - 5 \times 10^{21}/cm^3$, and the thickness of n+ oxide layer 120 is about 50–250 nm. Because of the PSG layer 120 is deposited as an n-type diffusion source for forming buried bit line, and thus it is not necessary to perform high temperature flowing process. On the other hand, the pad oxide 110 is served as insulting the contamination into the silicon substrate when the PSG is directed deposited on the silicon substrate 100.

Figure 3:
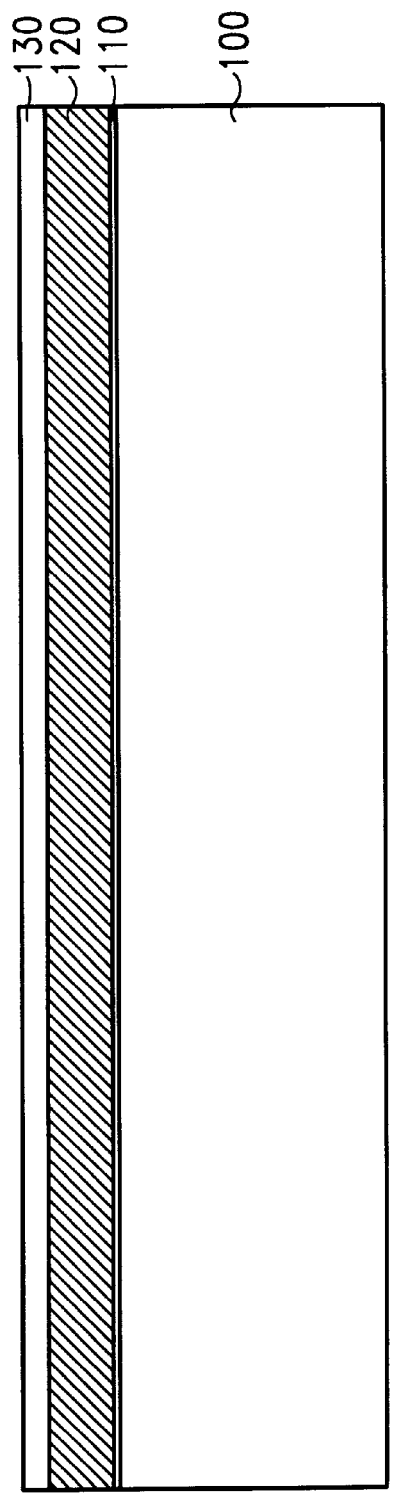
FIG. 3. is a cross-sectional view of deposited a nitride layer on the n+-doped oxide layer as an anti-reflection coating layer, in accordance with the present invention.

Referring to FIG. 3, an antireflection coating (ARC) layer such as a thin nitride layer 130 is then deposited on the n+ doped oxide layer 120 at a temperature of about 300–750° C. to a thickness about 10–50 nm. The low pressure CVD deposition SiN$_x$ layer on silicon layer for bottom antireflection coating has been found to be manufacturable for deep U-V and I-line lithography, as is reported by Ong in the reference, T. P. Ong, et al., "CVD SiN$_x$ Anti-Reflection Coating For Sub-0.5 μm Lithography", Symp., on VLSI Tech. Dig., p.73 1995.

As shown in FIG. 4, a patterned photoresist 140 is masked on the nitride layer 130 to define the floating gate area, and then etching steps are performed. A dry etching using CHF$_4$, CH$_3$CHF$_2$, CCl$_4$ and C$_3$F$_8$ as plasma source or reactive-ion-etching chemistries to remove successively the nitride layer 130, n+ oxide layer 120, pad oxide layer 110, and slightly recess the silicon substrate 100. As a result a plurality of shallow trenches 150 are formed to suppressing the short channel effect. Alternatively, using CF$_4$/O$_2$, SF$_6$, CHF$_3$ as an etchant to etching nitride layer 130 firstly, and then using bromine-based chemistries consisting of CF$_3$Br and HBr/NF$_3$ to recess the silicon in an anisotropic way.

The depth of the recessed silicon trenches with a depth of about 50–600 nm. This was reported in the paper by P. H. Bricout, et al., "Short-Channel Effect Immunity and Current Capability of Sub-0.1-Micron MOSFET's Using a Recessed Channel", IEEE Trans. Electron Devices, ED-43, p. 1251, 1996. In the paper, a comparison of suppressing short channel effect between the planar MOSFET and the recessed channel MOSFET was investigated using both drift-diffusion and Monte Carlo simulation. The threshold voltage roll-off (e.g., threshold voltage roll-off increases the off current level and power dissipation) is clearly presented for the planar device, however, the recessed structure nearly keeps the same threshold voltage for all simulated channel lengths and for any gate oxide thickness. In addition for the device shorter than 50 nm, only a slow increase of the threshold swing is obtained in the recessed MOSFET's device.

Referring to FIG. 5, a thermal oxidation process at a temperature of about 800–1150° C. in N$_2$O or NO ambient is carried out to grow a thin oxynitride layer 160 to about 5–300 nm in thickness on the resultant silicon substrate. The ultra-thin oxynitride 160 can be used to recover the etching damage. This is reported in the reference, S. Y. Ueng, et al., "Superior Damage-Immunity of Thin Oxides Thermally Grown on Reactive-Ion-Etched Silicon Surface in N$_2$O Ambient", IEEE Trans. Electro Devices, ED-41, p. 850, 1994." The N$_2$O-grown oxides can remedy the RIE-induced defects, and exhibit significantly stronger immunity to RIE-induced damages. In addition, the MOS capacitor (MOSC) with oxynitride as a dielectric layer shows a great improvement over those of MOSC with pure oxygen ambient grown dielectric in the leakage currents and breakage fields. Further, the growth rate of the oxynitride 160 is slow, hence the thickness and conformity are well under-controlled. It is noted that during thermal oxidation, the dopants in the oxide layer 120 will be driven through the ultra-thin pad oxide layer 110 into the silicon substrate 100 to form the buried bit line 170.

Figure 6A:
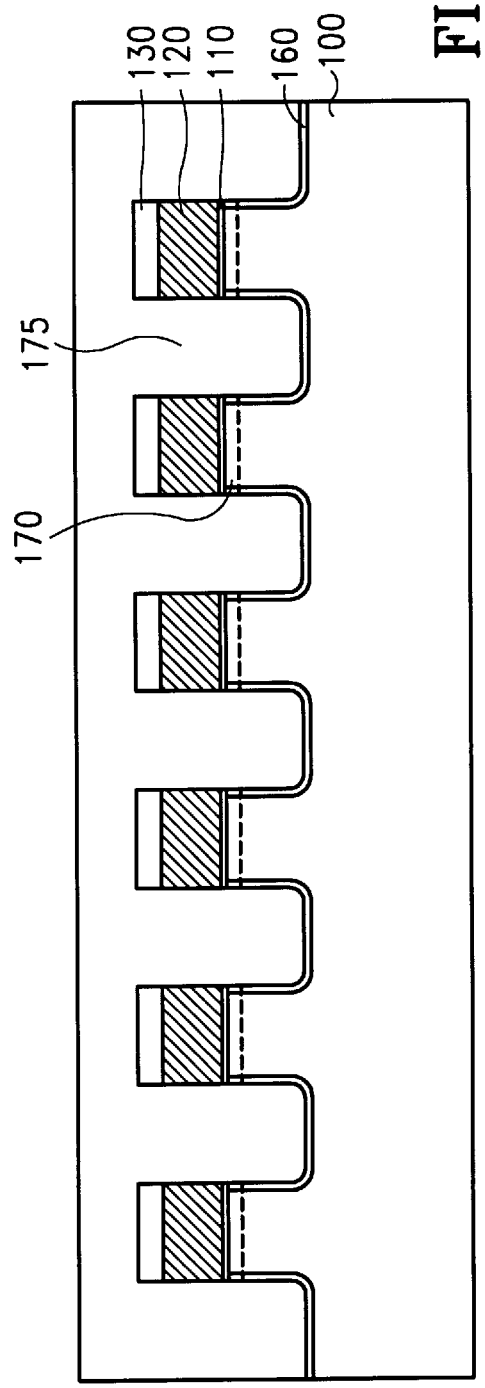
FIG. 6. is a cross-sectional view of refilling all trenches with n+ doped polysilicon or α-Si (FIG. 6a), and then performing planarization process by a CMP process (FIG. 6b), in accordance with the present invention.
Figure 6B:
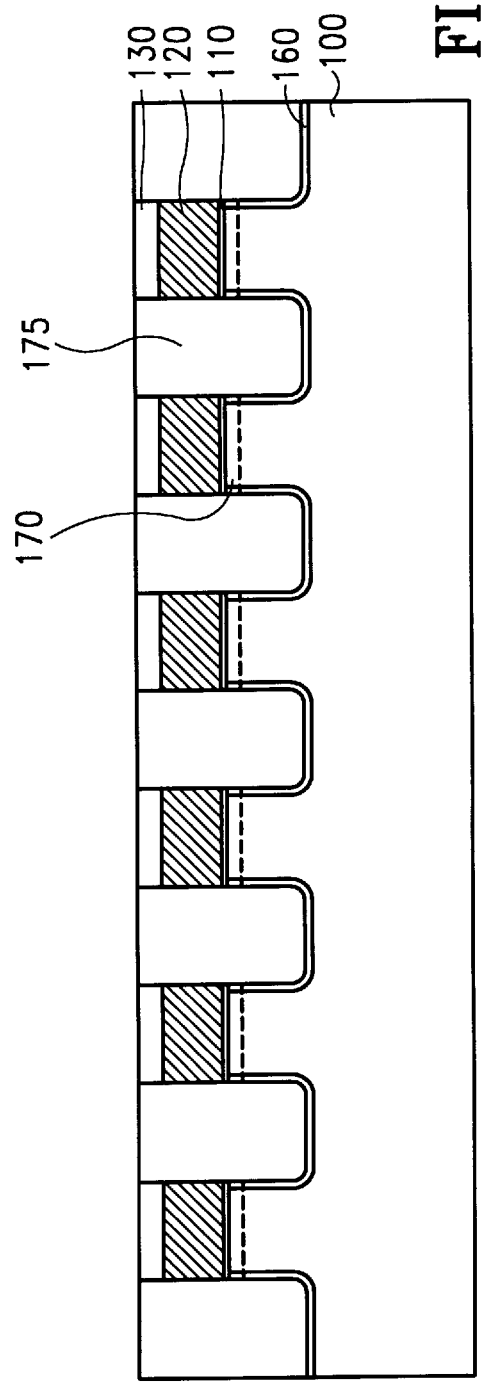

Referring to FIG. 6a, an in-situ n-type doped polysilicon layer or an amorphous silicon (α-Si) layer 175 is deposited to refill the shallow trenches 150. To deposit the α-Si layer 175, a method such as a LPCVD or a PECVD can be used (operate at temperature about 400–550° C. or 250–400° C., respectively). However, to deposit the polysilicon layer 175, a higher temperature process (at temperatures of about 580–650° C.) such as a LPCVD is required. Which kind of silicon layer types being selected relies on the trench width (for an example, to refill the trench for 0.1–0.2 $\mu$m width, $\alpha$-Si is prefer, but for 0.25 $\mu$m or above, the material can be poly-Si or $\alpha$-Si). In a preferred embodiment, in-situ phosphorus doped or arsenic doped Si is preferred, and the concentration is about $5\times10^{19}$–$5\times10^{21}$/cm$^3$. Thereafter, as shown in FIG. 6b a planarization process such as a chemical/mechanical polish (CMP) process using the nitride layer 120 as a CMP stopping layer is achieved to form a flat surface. The n+ doped polysilicon layer 175 serves as a floating gate of the flash memory.

Figure 7:
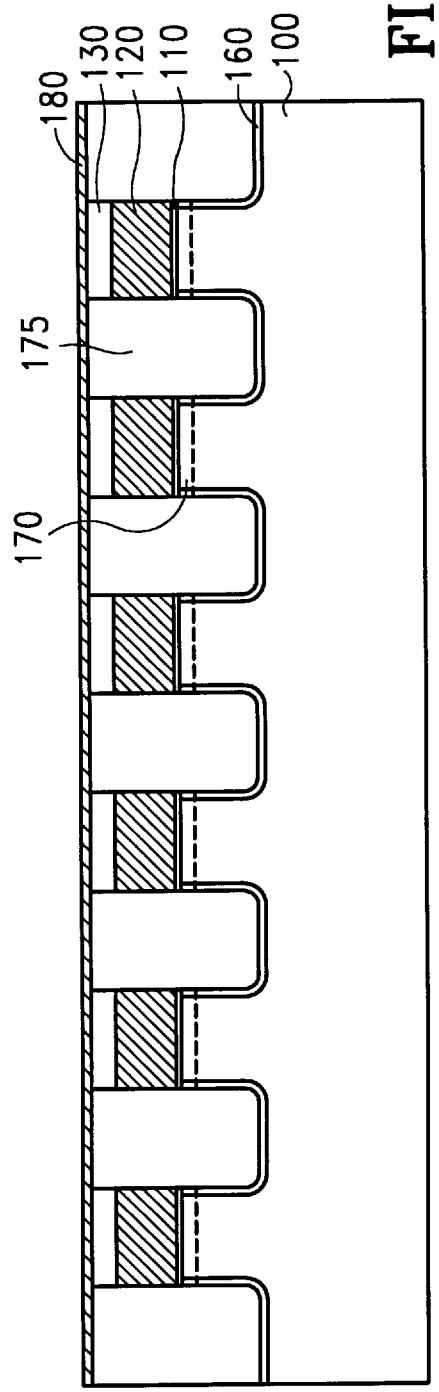
FIG. 7. is a cross-sectional view of forming a thin stacked ONO layer as an interpoly dielectric layer, in accordance with the present invention.

Referring to FIG. 7, after the CMP process, a thin stacked ONO 180 is formed as the interpoly dielectric 180. Preferably, the "ONO" layer refers the nitride layer formed using LPCVD on a thermal oxidation layer firstly, and then re-oxidation again to grow an oxide layer. The ONO layer has the properties of extreme dielectric integrity and long life time in breakdown characteristics. The thickness of upper oxide/nitride/lower oxide of ONO 180 is, respectively, about 1–5 nm, 4–20 nm, and 1–5 nm.

Next referring to FIG. 8, another n+ polysilicon layer 190 is deposited on all areas, and patterned to defined word lines. In a preferred embodiment, a CVD method, such as LPCVD is performed at a temperature of about 450–650° C., and the doping concentration is about $5\times10^{19}$–$5\times10^{21}$/cm$^3$.

Figure 9:
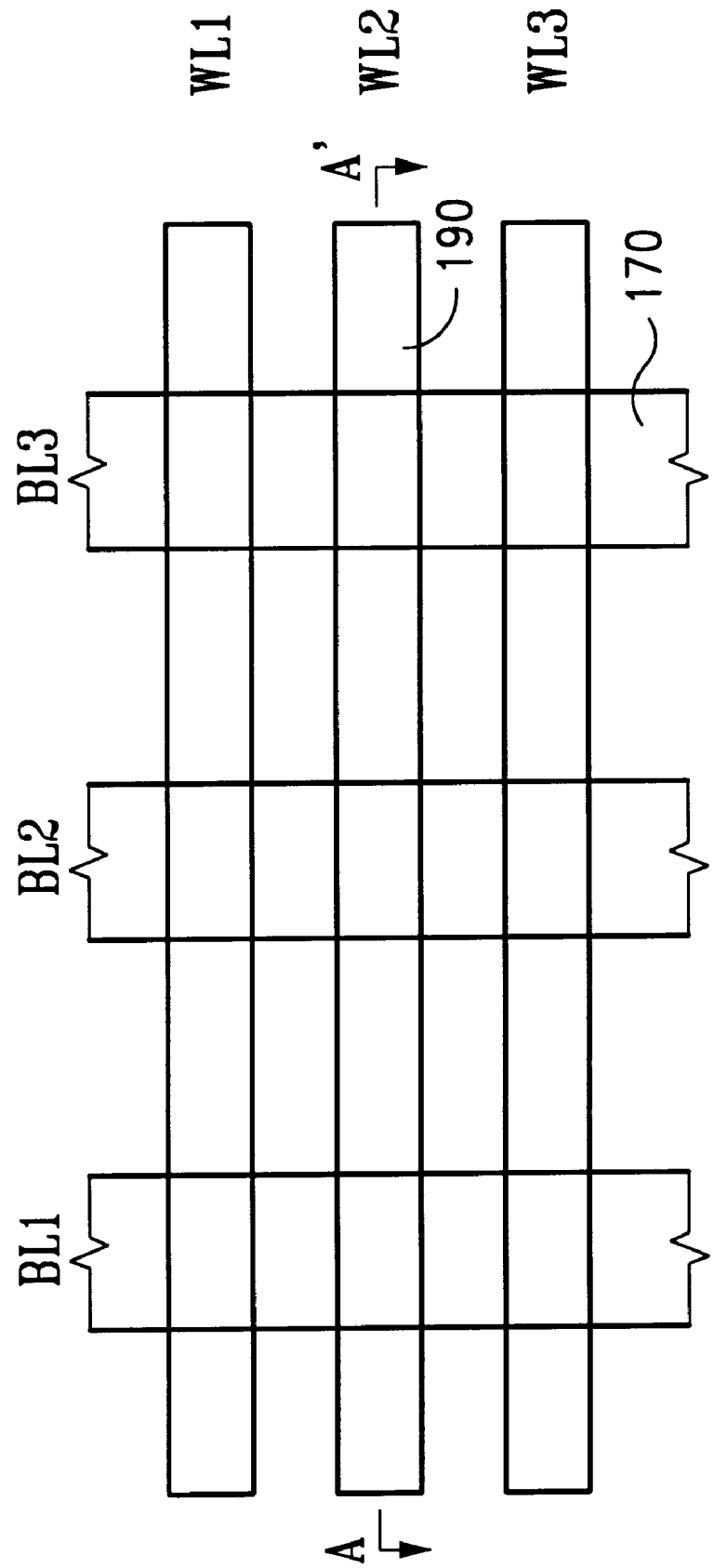
FIG. 9. is a top view of high density contactless flash memory with buried bit line and shallow trench floating gate, in accordance with the present invention.

FIG. 9 is a top-view diagram illustrating the high-density contactless nonvolatile memory with buried bit line and floating gate in the silicon trench region, wherein the source/drain regions are bit lines 170, and the polysilicon gate 190 are word lines. The view along the word line A—A', gives the cross-section of flash memories, as depicted in FIGS. 2–8.

In conclusion, the benefits of this invention are:

(1) high density and low power non-volatile memories can be achieved (due to cell structure with contactless array);

(2) the short channel effect can be suppressed due to the recessed silicon gate structure; and (3) the punchthrough issue between two narrow adjacent bit lines can be minimized.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A structure of buried bit line flash EEPROM cell with a trench floating gate comprising:

a composite layer formed on a semiconductor substrate, said composite layer having a trench, which is with a bottom coming down into said semiconductor substrate, thereby forming a remnant portion of said composite layer, said remnant portion of composite layer comprising:

a pad oxide layer formed on said semiconductor substrate, a phosphorus doped dielectric layer formed on said pad oxide layer, and a first isolation layer formed on said phosphorus doped dielectric layer;

an oxynitride layer formed on a surface of said semiconductor substrate which is in sidewalls and bottom of said trench;

a first conductive layer formed in said semiconductor substrate of said remnant portion of said composite layer to serve as buried bit line;

a second conductive layer formed in said trench so as to form said trench floating gate;

a second isolation formed on said second conductive layer and said first isolation; and a third conductive layer formed on said second isolation.

2. The EEPROM of claim 1, wherein said pad oxide layer is about 2–20 nm in thickness.

3. The EEPROM of claim 1, wherein said n-type doped dielectric layer is an oxide layer with a thickness of about 50–250 nm and contains phosphorus come up to concentrations of about $5\times10^{19}$–$5\times10^{21}$/cm$^3$.

4. The EEPROM of claim 1, wherein said first isolation layer is a nitride layer with a thickness of about 10–50 nm.

5. The EEPROM of claim 1 wherein said trench is about 50–600 nm in depth which is measured from the upper surface of said semiconductor substrate to the bottom of said trench.

6. The EEPROM of claim 1, wherein said oxynitride layer is formed to a thickness of about 5–30 nm.

7. The EEPROM of claim 1, wherein said first conductor layer is a n-type doped containing semiconductor substrate layer.

8. The EEPROM of claim 1, wherein said second conductor layer is a polysilicon layer, and contains n-type dopants to concentrations of about $5\times10^{19}$–$5\times10^{22}$/cm$^3$.

9. The EEPROM of claim 1, wherein said second isolation layer is an ONO layer, said ONO with a second oxide layer over a nitride layer/first oxide layer to about 1–5 nm, and 4–20 nm/1–5 nm, respectively.

10. The EEPROM of claim 1, wherein third conductive layer is a polysilicon layer with n-type doping concentrations of about $5\times10^{19}$–$5\times10^{21}$/cm$^3$.

11. The EEPROM of claim 1, wherein said second conductive layer is filled in said trench so as to form said trench floating gate.

12. A structure of buried bit line flash EEPROM cell with a trench floating gate comprising:

a composite layer formed on a semiconductor substrate, said composite layer having a trench, which is with a bottom coming down into said semiconductor substrate, thereby forming a remnant portion of said composite layer, said remnant portion of composite layer comprising:

a pad oxide layer formed on said semiconductor substrate, a phosphorus doped dielectric layer formed on said pad oxide layer, and a first isolation layer formed on said phosphorus doped dielectric layer;

an oxynitride layer formed on a surface of said semiconductor substrate which is in sidewalls and bottom of said trench;

a first conductive layer formed in said semiconductor substrate of said remnant portion of said composite layer to serve as buried bit line;

a second conductive layer formed and filled in said trench so as to form said trench floating gate;

a second isolation formed on said second conductive layer and said first isolation; and a third conductive layer formed on said second isolation.

13. The EEPROM of claim 12, wherein said first isolation layer is a nitide layer with a thickness of about 10–50 nm.

14. The EEPROM of claim 12, wherein said oxynitride layer is formed to a thickness of about 5–30 nm.

15. The EEPROM of claim 12, wherein said first conductor layer is a n-type doped containing semiconductor substrate layer.

16. The EEPROM of claim 12, wherein said second isolation layer is an ONO layer, said ONO with a second oxide layer over a nitride layer/first oxide layer to about 1–5 nm, and 4–20 nm/1–5 nm, respectively.

17. The EEPROM of claim 12 wherein said trench is about 50–600 nm in depth which is measured from the upper surface of said semiconductor substrate to the bottom of said trench.

* * * * *